(12) United States Patent
Jeong et al.

(10) Patent No.: US 10,488,576 B2
(45) Date of Patent: Nov. 26, 2019

(54) IMAGE DISPLAY APPARATUS

(71) Applicant: LG ELECTRONICS INC., Seoul (KR)

(72) Inventors: Chansung Jeong, Seoul (KR); Sangtae Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/033,113

(22) Filed: Jul. 11, 2018

(65) Prior Publication Data

US 2019/0020842 A1    Jan. 17, 2019

(30) Foreign Application Priority Data

Jul. 13, 2017   (KR) ........................ 10-2017-0089083

(51) Int. Cl.
```
G06F 1/16      (2006.01)
G06F 3/0488    (2013.01)
H04N 21/422    (2011.01)
H04R 1/02      (2006.01)
H04N 5/38      (2006.01)
```
(Continued)

(52) U.S. Cl.
CPC .......... *G02B 6/0053* (2013.01); *G02B 5/1876* (2013.01); *G06F 1/1605* (2013.01); *G06F 3/0488* (2013.01); *H01L 27/3297* (2013.01); *H01L 51/5275* (2013.01); *H04N 5/38* (2013.01); *H04N 5/63* (2013.01); *H04N 5/655* (2013.01);
(Continued)

(58) Field of Classification Search
CPC ...... G02B 6/0053; G02B 5/1876; H04N 5/38; H04N 5/63; H04N 5/655; H04N 21/42219; G06F 1/1605; G06F 3/0488; H01L 27/3297; H01L 51/5275; H04R 1/025; H04R 2499/15
USPC ......... 385/15, 31–33, 36, 39, 129–131, 147, 385/901; 138/104; 174/68.1, 68.3
See application file for complete search history.

(56) References Cited

U.S. PATENT DOCUMENTS

| | | | |
|---|---|---|---|
| 7,381,896 B2 * | 6/2008 | Park | H02G 3/0418 138/104 |
| 2007/0272427 A1 | 11/2007 | Park | |
| 2015/0170793 A1 | 6/2015 | Horii et al. | |

FOREIGN PATENT DOCUMENTS

| | | |
|---|---|---|
| JP | 2002042567 | 2/2002 |
| JP | 2011003331 | 1/2011 |
| KR | 200422044 | 7/2006 |

OTHER PUBLICATIONS

PCT International Application No. PCT/KR2018/007883, International Search Report dated Nov. 7, 2018, 3 pages.

* cited by examiner

*Primary Examiner* — Michael P Mooney
(74) *Attorney, Agent, or Firm* — Lee, Hong, Degerman, Kang & Waimey PC

(57) ABSTRACT

An image display apparatus includes a display, a signal processing device spaced apart from the display to transmit power and a video signal to the display, a plurality of cables configured to transmit power and the video signal from the signal processing device, and an optical sheet attached to the cables. The optical sheet includes a Fresnel pattern formed on the plurality of cables and transparent partition walls formed between the plurality of cables. The Fresnel pattern includes a plurality of peaks and valleys and differences in depth between the peaks and the valleys are decreased from the cables to the transparent partition walls. Therefore, the (Continued)

cables provided between the display and the signal processing device appear transparent.

19 Claims, 15 Drawing Sheets

(51) Int. Cl.
    *G02B 5/18*           (2006.01)
    *H01L 27/32*         (2006.01)
    *H04N 5/63*          (2006.01)
    *H04N 5/655*         (2006.01)
    *H01L 51/52*         (2006.01)
    *F21V 8/00*          (2006.01)

(52) U.S. Cl.
    CPC ....... *H04N 21/42219* (2013.01); *H04R 1/025* (2013.01); *H04R 2499/15* (2013.01)

IMAGE DISPLAY APPARATUS

CROSS-REFERENCE TO RELATED APPLICATION

Pursuant to 35 U.S.C. § 119(a), this application claims the benefit of earlier filing date and right of priority to Korean Patent Application No. 10-2017-0089083, filed on Jul. 13, 2017, the contents of which are hereby incorporated by reference herein in its entirety.

BACKGROUND OF THE INVENTION

1. Field of the Invention

The present invention relates to an image display apparatus, and more particularly, to an image display apparatus in which a cable provided between a display and a signal processing device may appear transparent.

2. Description of the Related Art

A display apparatus outputs an image. The display apparatus may output an image using various methods, that is, may output an image through a display panel or project an image using visible light.

Meanwhile, as the size and quality of an image display apparatus have been increased, a display of the image display apparatus and a signal processing device for supplying a video signal to the display are provided to be spaced apart from each other.

At this time, since a cable is provided between the display and the signal processing device, the color of the cable may reduce aesthetic effect.

SUMMARY OF THE INVENTION

Therefore, the present invention has been made in view of the above problems, and it is an object of the present invention to provide an image display apparatus, in which a cable provided between a display and a signal processing device may appear transparent.

In accordance with an aspect of the present invention, the above and other objects can be accomplished by the provision of an image display apparatus including a display, a signal processing device spaced apart from the display to transmit power and a video signal to the display, a plurality of cables configured to transmit power and the video signal from the signal processing device, and an optical sheet attached to the cables, wherein the optical sheet includes a Fresnel pattern formed on the plurality of cables and transparent partition walls formed between the plurality of cables, and wherein the Fresnel pattern includes a plurality of peaks and valleys and differences in depth between the peaks and the valleys are decreased from the cables to the transparent partition walls.

According to another aspect of the present invention, there is provided an image display apparatus including a display, a signal processing device spaced apart from the display to transmit power and a video signal to the display, a plurality of cables configured to transmit power and the video signal from the signal processing device, and an optical sheet attached to the cables, wherein the optical sheet includes a Fresnel pattern formed on the plurality of cables and transparent partition walls formed between the plurality of cables, and wherein the Fresnel pattern includes a plurality of peaks and valleys and virtual extensions of the plurality of valleys are aspherical curves.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

The suffixes "module" and "unit" in elements used in description below are given only in consideration of ease in preparation of the specification and do not have specific meanings or functions. Therefore, the suffixes "module" and "unit" may be used interchangeably.

Figure 1:
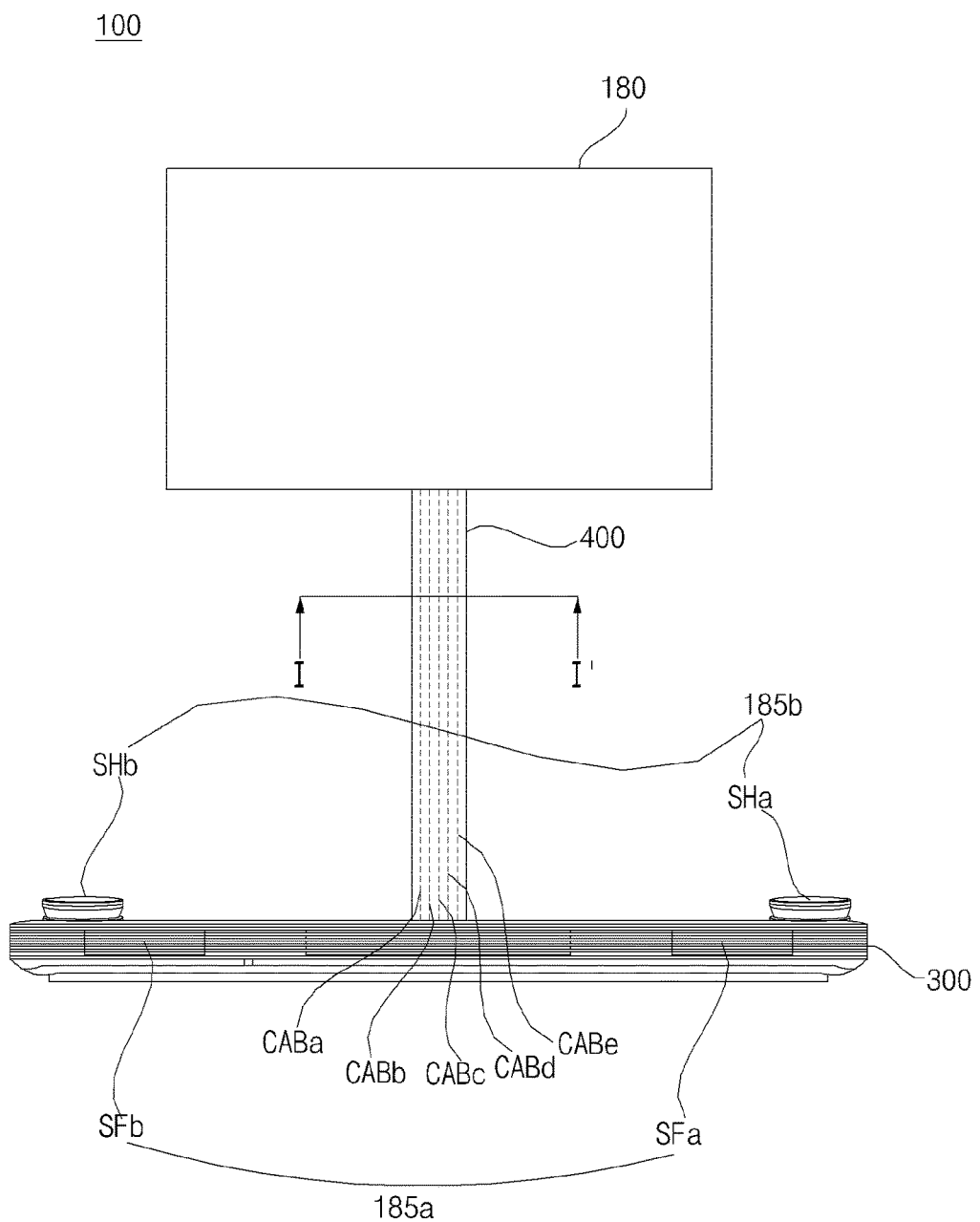
FIG. 1 is a diagram showing an image display apparatus according to an embodiment of the present invention.

FIG. 1 is a diagram showing an image display apparatus according to an embodiment of the present invention.

Referring to FIG. 1, the image display apparatus 100 according to one embodiment of the present invention may include a display 180, a signal processing device 300 spaced apart from the display 180 to supply power and a video signal to the display 180, and a plurality of cables CABa to CABe for transmitting power and the video signal from the signal processing device 300.

Meanwhile, in order to make the plurality of cables CABa to CABe provided between the display 180 and the signal processing device 300 invisible, in the present invention, an optical sheet 400 having a Fresnel pattern formed therein is employed.

The optical sheet 400 includes a Fresnel pattern 410 formed on the plurality of cables CABa to CABe and transparent partition walls BWo and BWa to BWe formed between the plurality of cables CABa to CABe. The Fresnel pattern 410 includes a plurality of peaks Pm and valleys. Differences in depth between the peak and the valley are decreased from the cables CABa to CABe to the transparent partition walls BWo and BWa to BWe.

A user located at a front side of the cables CABa to CABe cannot view the cables CABa to CABe but can view transparent partition walls BWo and BWa to BWe. Accordingly, the cables CABa to CABe provided between the display 180 and the signal processing device 300 appear transparent.

An effect of a lens is implemented by the Fresnel pattern 410. In particular, virtual extensions of the plurality of valleys are aspherical curves and the depth of the valley increases from the transparent partition walls BWo and BWa to BWe to the cables CABa to CABe, thereby further increasing refractive index. Therefore, the cables CABa to CABe are made invisible and the transparent partition walls BWo and BWa to BWe are made visible from the front side of the cables CABa to CABe. This will be described in greater detail with reference to FIG. 3 and subsequent figures thereof.

Meanwhile, the signal processing device 300 may transmit a pointer image based on motion information of a remote controller (200 of FIG. 12) to the display 180 through the cables CABa to CABe. Thus, the pointer image can be displayed on the display 180.

Meanwhile, the plurality of cables CABa to CABe may include a power cable, a video cable, a control signal cable, etc. The power cable which may generate more heat may be provided at an outermost side of the cables. For example, the power cable may be CABa or CABe.

Meanwhile, the signal processing device 300 may include a first speaker unit 185a capable of outputting first sound in a front direction and a second speaker unit 185b capable of outputting second sound toward a ceiling 500.

Meanwhile, in the figure, speakers SFa and SFb belonging to the first speaker unit 185a are provided at the front side of the signal processing device 300 and array speakers SHa and SHb belonging to the second speaker unit 185b are provided on the signal processing device 300.

Meanwhile, first sound output from the first speaker unit 185a is output toward the user and second sound output from the second speaker unit 185a is output toward the ceiling 500 and is reflected from the ceiling 500 to reach the user.

At this time, the first sound and the second sound may have different directivities and may not generate sound interference.

In the present invention, in particular, in order to improve directivity of second sound, the second speaker unit 185b includes an array speaker SHA including a plurality of speakers Sa1 to Sa7.

Although the array speaker SHa includes seven speakers Sa1 to Sa7 in the figure, various modifications are possible and at least 13 speakers may be provided.

Meanwhile, directivity of the array speaker is significantly superior to a general speaker. Accordingly, by using the array speaker SHa, it is possible to reduce sound interference between first sound directed in the front direction and second sound directed to the ceiling 500.

Figure 2A:
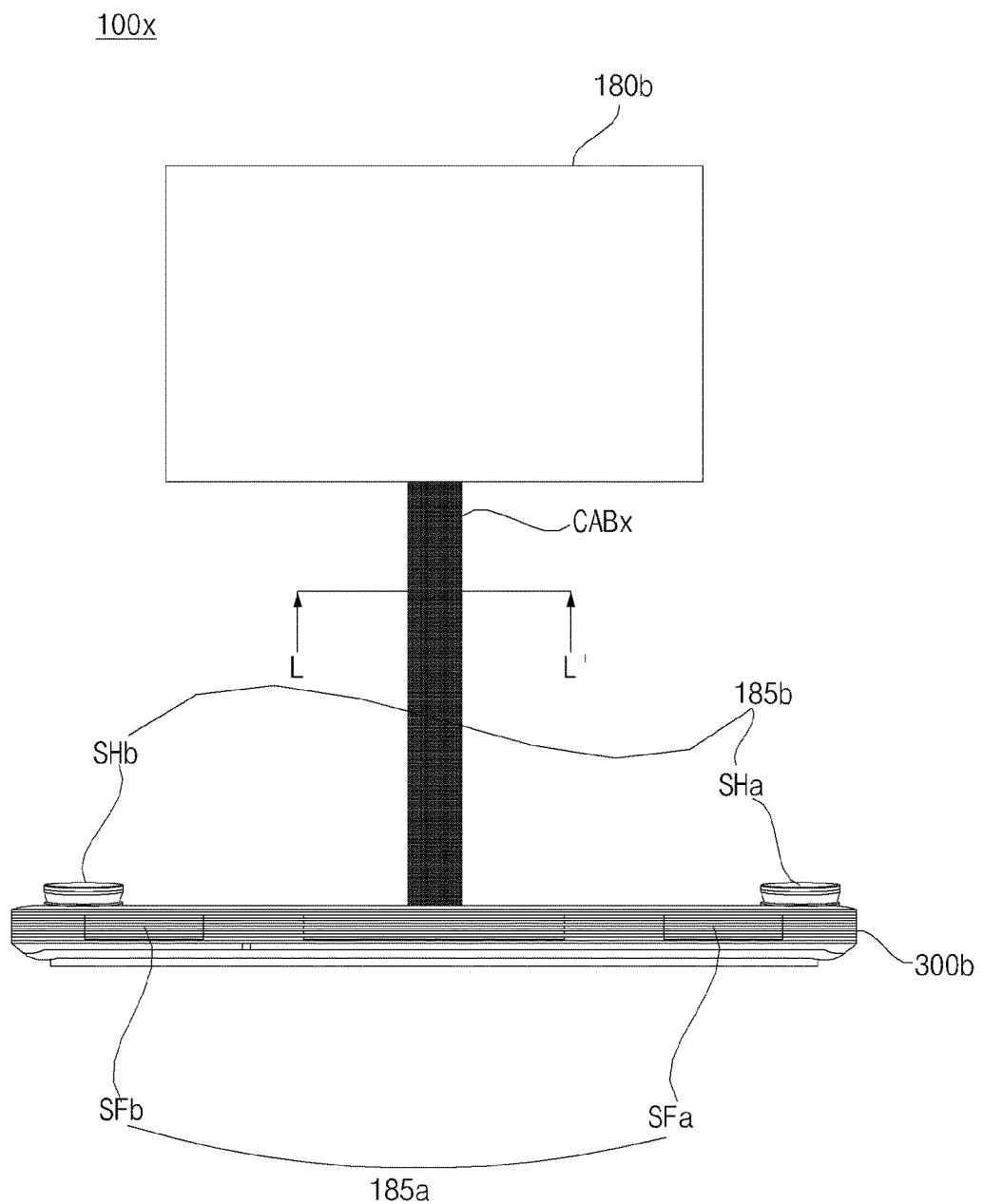
FIG. 2A is a diagram showing the appearance of an image display apparatus related to the present invention.
Figure 2B:
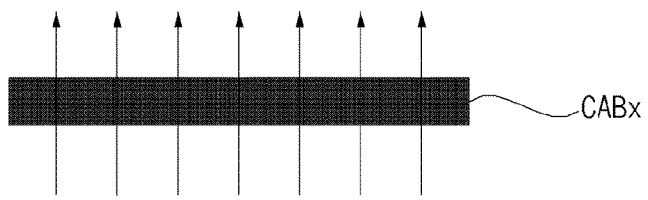
FIG. 2B is a cross-sectional view taken along line L-L' of FIG. 2A.

FIG. 2A is a diagram showing the appearance of an image display apparatus related to the present invention, and FIG. 2B is a cross-sectional view taken along line L-L' of FIG. 2A.

The image display apparatus 100x of FIG. 2A includes a display 180b and a signal processing device 300b, similarly to FIG. 1. A cable CABx is provided between the display 180b and the signal processing device 300b.

The cable CABx may be a combination of the plurality of cables of FIG. 1.

In this case, as shown in FIG. 2B, the color of the cable CABx may reduce aesthetic effect. In particular, if the color of the cable CABx is black, the aesthetic effect is significantly low.

In the present invention, in order to implement a transparent cable, a transparent partition wall is provided between the plurality of cables and a Fresnel pattern for refraction of light is formed on the plurality of cables and some of the transparent partition wall. This will be described with reference to FIG. 3.

Figure 3:
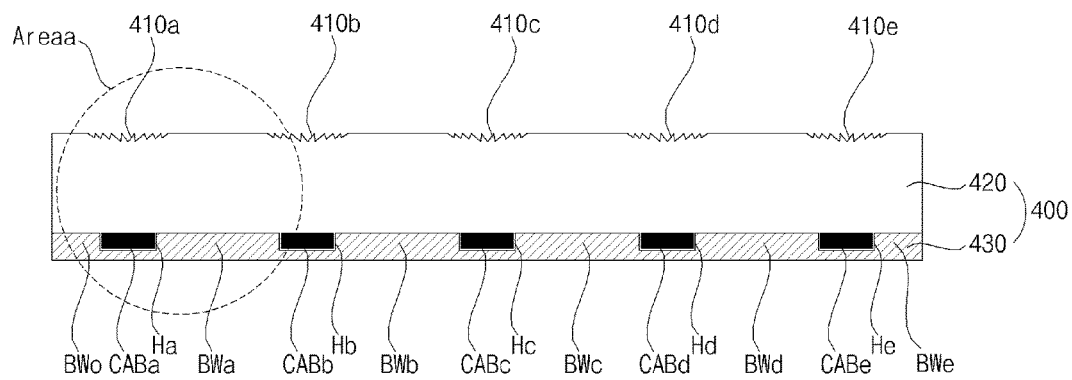
FIG. 3 shows an example of a cross-sectional view taken along line I-I' of FIG. 1.
Figure 4:
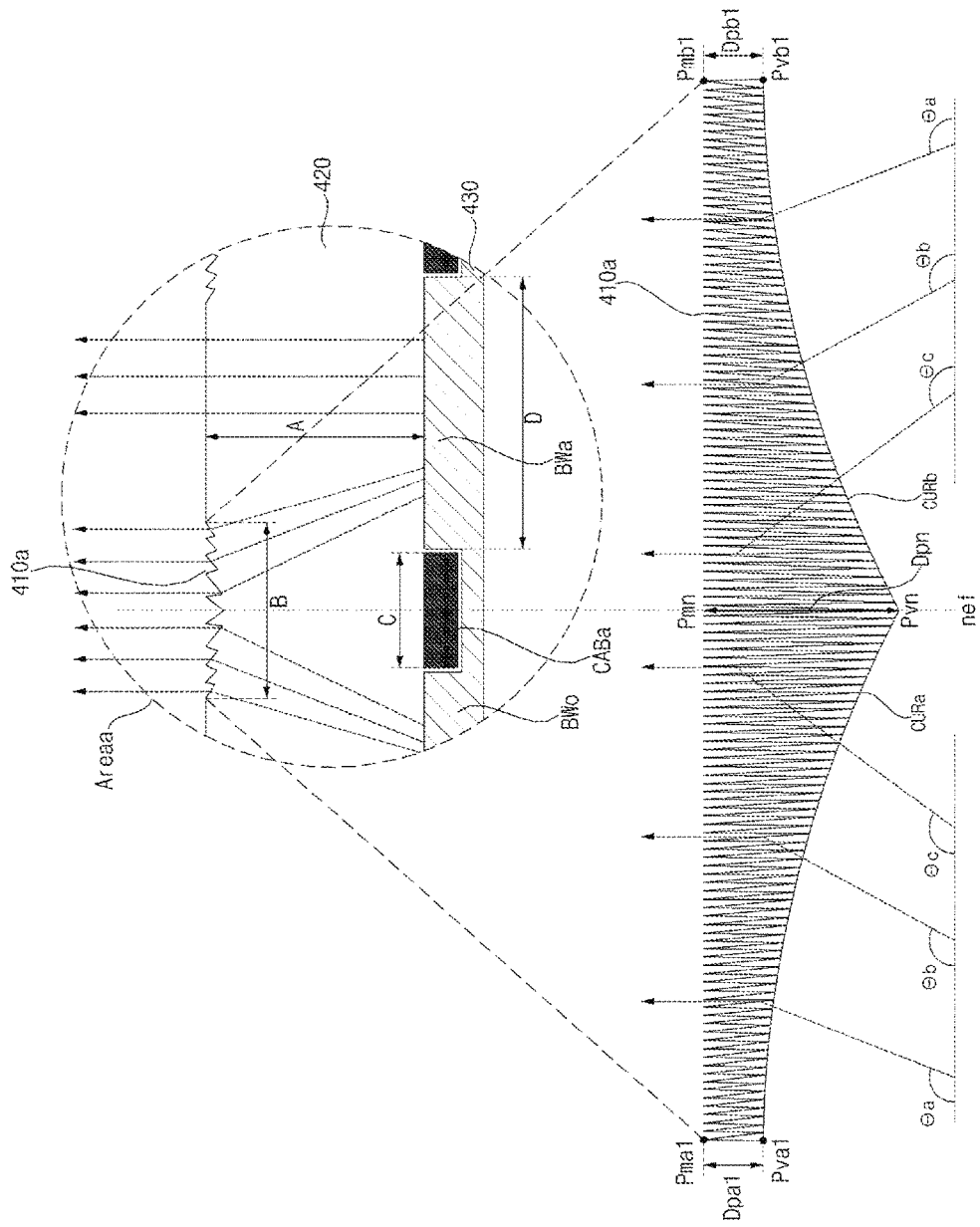
FIG. 4 is an enlarged view of Area of FIG. 3.

FIG. 3 shows an example of a cross-sectional view taken along line I-I' of FIG. 1, and FIG. 4 is an enlarged view of Area of FIG. 3;

Referring to the figure, the optical sheet 400 of FIG. 3 may include a Fresnel pattern 410 formed on a plurality of cables CABa to CABe and transparent partition walls BWo and BWa to BWe formed between the plurality of cables CABa to CABe.

Referring to FIG. 3, the optical sheet 400 may include grooves Ha to He formed in the transparent partition walls BWo and BWa to BWe or 430. The cables CABa to CABe may be provided in the grooves Ha to He.

In addition, the optical sheet 400 may include a base part 420 formed on the transparent partition walls BWo and BWa to BWe and the cables CABa to CABe and a plurality of Fresnel patterns 401a to 410e formed in the base part 420.

The plurality of Fresnel patterns 401a to 410e includes a plurality of peaks Pma1 to PMn and PMb1 to PMn and valleys Pva1 to Pvn and PVb1 to PVn. Differences DPn to Dpa1 and Dpn to Dpb1 in depth between the plurality of peaks Pma1 to PMn and PMb1 to PMn and valleys Pva1 to Pvn and PVb1 to PVn are decreased from the cables CABa to CABe to the transparent partition walls BWo and BWa to BWe.

That is, in particular, the differences DPn to Dpa1 and Dpn to Dpb1 in depth between the plurality of peaks Pma1 to PMn and PMb1 to PMn and valleys Pva1 to Pvn and PVb1 to PVn are decreased from the center nef of the cables CABa to CABe to the transparent partition walls BWo and BWa to BWe.

In particular, as shown in the enlarged view of FIG. 4, the heights of the plurality of peaks Pma1 to PMn and PMb1 to PMn are constant and the heights of the valleys Pva1 to Pvn and PVb1 to PVn are increased from the cables CABa to CABe to the transparent partition walls BWo and BWa to BWe. As a result, the differences DPn to Dpa1 and Dpn to Dpb1 in depth between the peaks and the valleys may be decreased.

Since the differences DPn to Dpa1 and Dpn to Dpb1 in depth between the plurality of peaks Pma1 to PMn and PMb1 to PMn and the valleys Pva1 to Pvn and PVb1 to PVn are decreased from the cables CABa to CABe to the transparent partition walls BWo and BWa to BWe, refraction of light is increased from the transparent partition walls BWo and BWa to BWe to the cables CABa to CABe, thereby making the cables CABa to CABe invisible and the transparent partition walls BWo and BWa to BWe visible from the front side of the cables CABa to CABe.

In other words, since the differences DPn to Dpa1 and Dpn to Dpb1 in depth between the plurality of peaks Pma1 to PMn and PMb1 to PMn and the valleys Pva1 to Pvn and PVb1 to PVn are increased from the transparent partition walls BWo and BWa to BWe to the cables CABa to CABe, refraction of light is increased from the transparent partition walls BWo and BWa to BWe to the cables CABa to CABe, thereby making cables CABa to CABe invisible and the transparent partition walls BWo and BWa to BWe visible from the front side of the cables CABa to CABe.

The user located at the front side of the cables CABa to CABe cannot view the cables CABa to CABe and can view transparent partition walls BWo and BWa to BWe. Accordingly, the cables CABa to CABe provided between the display 180 and the signal processing device 300 may appear transparent.

In the enlarged view of FIG. 4, the refraction angle of light is gradually increased in order of θa, θb and θc from the transparent partition walls BWo and BWa to BWe to the cables CABa to CABe.

Meanwhile, as shown in the enlarged view of FIG. 4, the heights of plurality of peaks Pma1 to PMn and PMb1 to PMn are constant and the heights of the valleys Pva1 to Pvn and PVb1 to PVn are increased from the cable CABa to the transparent BMO and BMa, and the virtual extensions of the plurality of valleys Pva1 to Pvn and PVb1 to PVn may correspond to aspherical curves CURa and CuRb.

That is, the heights of the valleys Pva1 to Pvn and PVb1 to PVn may be nonlinearly increased from the cable CABa to the transparent partition walls BMo and BMa. In particular, change in the heights of the valleys Pva1 to Pvn and PVb1 to PVn may be gradually increased from the cable CABa to the transparent partition walls BMo and BMa.

Therefore, since change in the heights of the valleys Pva1 to Pvn and PVb1 to PVn is gradually increased from the cable CABa to the transparent partition walls BMo and BMa, that is, the height is nonlinearly increased, a refractive index by the Fresnel pattern 410 may be nonlinearly changed from the cable CABa to the transparent partition walls BMo and BMa.

Therefore, the refractive index by the Fresnel pattern 410 is further decreased from the cable CABa to the transparent partition walls BMo and BMa.

That is, the refractive index by the Fresnel pattern 410 is further increased from the transparent partition walls BMo and BMa to the cable CABa. Therefore, the cables CABa to CABe are made invisible and the transparent partition walls BWo and BWa to BWe are made visible from the front side of the cables CABa to CABe.

In particular, since only the plurality of Fresnel patterns is used without providing an optical lens in the optical sheet 400, the thickness of the optical sheet 400 can be reduced.

Meanwhile, as shown in FIG. 4, the width B of the Fresnel pattern 410a may be greater than the width C of the cable CABa.

As shown in FIG. 4, the Fresnel pattern 410a is formed in an end of the optical sheet 400 corresponding to the upper side of the cable CABa and some of the upper side of the transparent partition walls BMo and BMa, such that light output from the transparent partition wall BMo and BMa may be further refracted toward the cable CABa through the Fresnel pattern 410.

Meanwhile, the Fresnel pattern 410a may be engraved as shown in FIG. 4. Therefore, since the Fresnel pattern 410 is engraved in some portions of the optical sheet 400, abrasion of the Fresnel pattern 410 may be reduced.

Meanwhile, the base part 420 may include silicon and the refractive index thereof may be about 1.42.

Meanwhile, the transparent partition wall BMo and BMa or 430 may include silicon and the refractive index thereof may be about 1.42.

Meanwhile, the refractive index of the Fresnel pattern 410 may be greater than that of the base part 420 and may be about 1.5 to 1.8.

Meanwhile, the height A of the base part 420 may be 1 to 5 mm.

The height A of the base part 410a may be greater than the width B of the Fresnel pattern 410a.

For example, if the width B of the Fresnel pattern 410a is increased to extend to the greater part of the transparent partition walls BMo and BMa in addition to the cable CABa, since the amount of light refracted toward the cable CABa of light output from the transparent partition walls BMo and BMa is increased by the Fresnel pattern 410a, light output from the transparent partition walls BMo and BMa may deteriorate.

The width B of the Fresnel pattern 410 may be greater than that of the cable CABa and may be less than the height A of the base part 420.

If the width B of the Fresnel pattern 410 is less than the height A of the base part 420, that is, if the width B of the Fresnel pattern 410 is greater than the height A of the base part 420, deterioration of light output from the transparent partition walls BMo and BMa may be reduced while the cable CAB is made invisible from the front side of the cable CABa.

The height A of the base part 420 may be greater than the width C of the cable CABa.

As described above, since the height A of the base part 420 is preferably greater than the width B of the Fresnel pattern 410, the height A of the base part 420 may be greater than the width C of the cable CABA, in order to reduce deterioration of light output from the transparent partition walls BMo and BMa while the cable CAB is made invisible from the front side of the cable CABa.

The width D of the transparent partition walls BMo and BMa is set to be greater than the width C of the cable CABa, such that the cable CABa is made invisible from the front side of the cable CABa, that is, the cable CABa appears transparent.

Figure 5A:
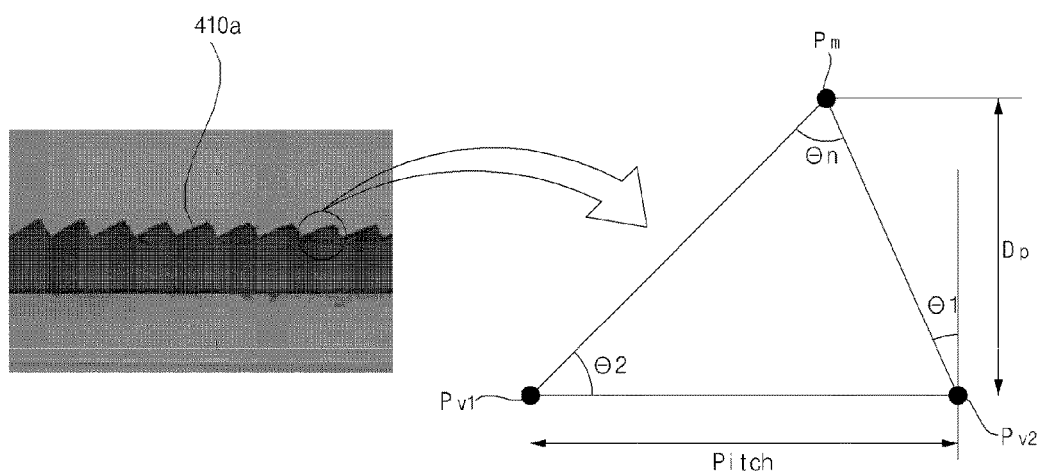
FIG. 5A is a diagram showing any one of a plurality of Fresnel patterns of FIG. 4.
Figure 5B:
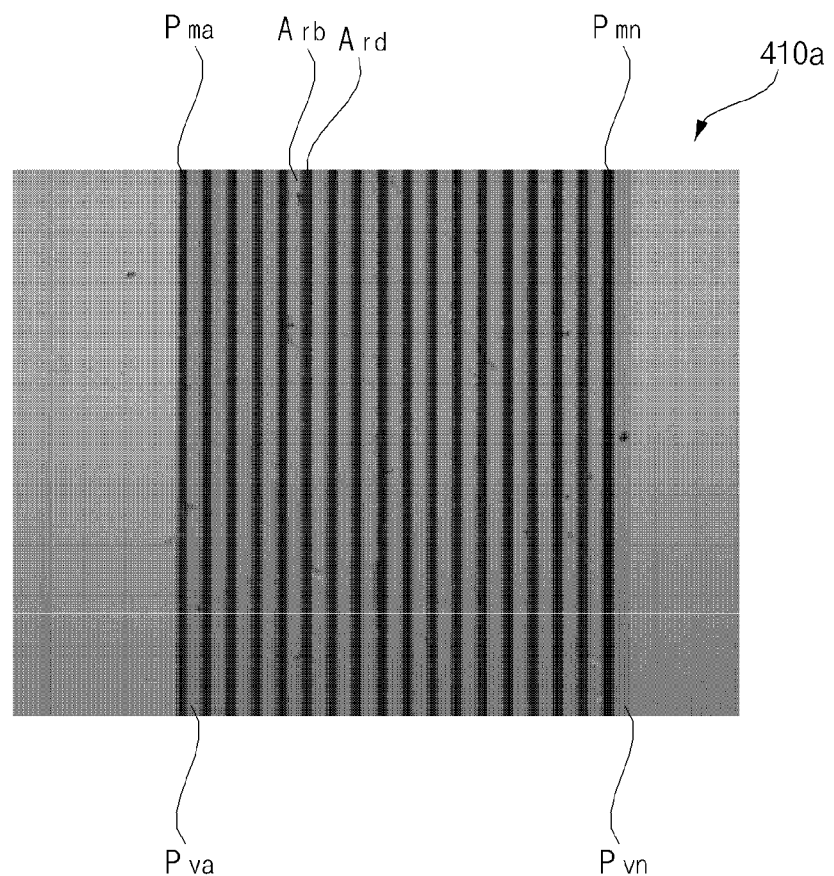
FIG. 5B is a top view of the plurality of Fresnel patterns of FIG. 4.

FIG. 5A is a diagram showing any one of a plurality of Fresnel patterns of FIG. 4, and FIG. 5B is a top view of the plurality of Fresnel patterns of FIG. 4.

First, referring to FIG. 5A, the Fresnel pattern 410 may include a peak Pm and valleys Pv1 and Pv2.

A distance between the valley Pv1 and the valley Pv2 may be defined as a pitch, an angle θ1 between the valley Pv2 and a vertical line may be defined as a draft angle, an angle θ2 between the valley Pv1 and a horizontal line may be defined as a Fresnel angle, and an internal angle of the peak Pm may be defined as a peak angle θn.

The Fresnel pattern 410 includes the plurality of peaks Pma1 to PMn and PMb1 to PMn and the valleys Pva1 to Pvn and PVb1 to PVn. As shown in FIG. 4, the angle θn of the peak Pm may be increased from the cable CABa to the transparent partition walls BMo and BMa.

If the angle θn of the peak Pm is increased from the cable CABa to the transparent partition walls BMo and BMa, that is, if the angle θn of the peak Pm is decreased from the transparent partition walls BMo and BMa to the cable CABa, light output from the transparent partition walls BMo and BMa is further refracted toward the cable CABa by the Fresnel pattern 410.

Accordingly, the cable CABa is made invisible and the transparent partition walls BMo and BMa are made visible from the front side of the cable CABa.

According to FIG. 5B, a bright area Arb and a dark area Ard are divided by the Fresnel pattern 410. In the figure, the bright area Arb has a greater width than the dark area Ard.

Among the parameters of the Fresnel pattern 410 defined in FIG. 5A, if the pitch is decreased from the cable CABa to the transparent partition walls BMo and BMa, the dark area Ard shown in FIG. 5B is decreased and thus the transparent partition walls BMo and BMa are further visible from the front side of the cable CABa. That is, the cable CABA cannot be recognized.

Among the parameters of the Fresnel pattern 410 defined in FIG. 5A, if the draft angle θ1 is decreased from the cable CABa to the transparent partition walls BMo and BMa, the dark area Ard shown in FIG. 5B is decreased and thus the transparent partition walls BMo and BMa are further visible from the front side of the cable CABa. That is, the cable CABA cannot be recognized.

Figure 6:
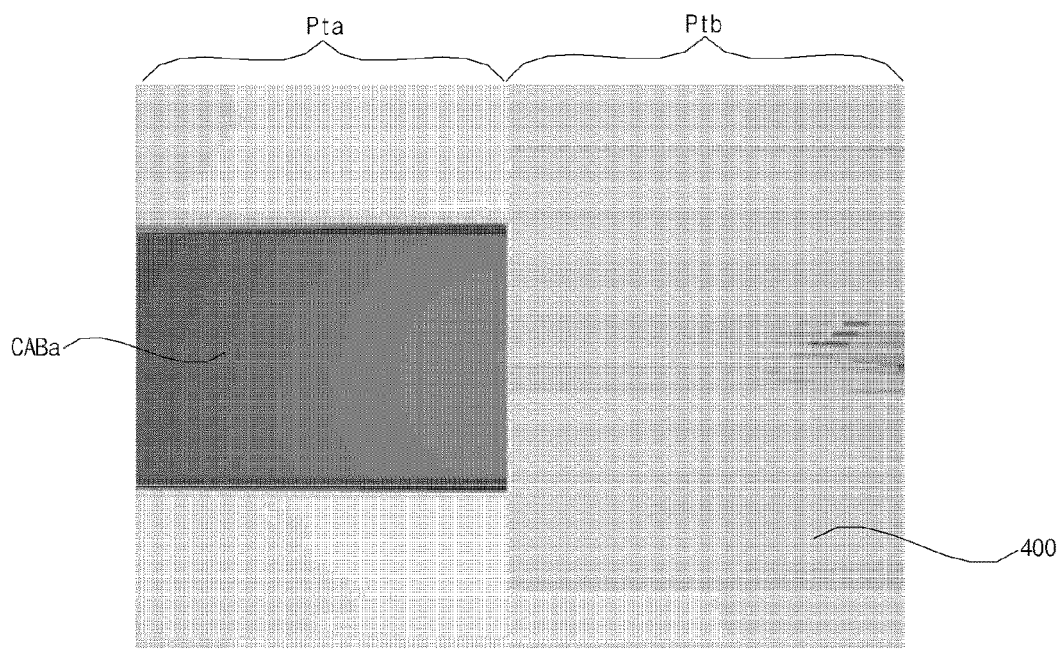
FIG. 6 is a view referred to for description of performance of an optical sheet of FIG. 1.

FIG. 6 is a view referred to for description of performance of the optical sheet of FIG. 1.

Referring to the figure, the optical sheet 400 is not attached in a first area Pta and the optical sheet 400 is attached in a second area Ptb.

Since the optical sheet 400 is not attached in the first area Pta, the cable CAba is recognized. However, since the optical sheet 400 is attached in the second area Ptb, the cable CAba is not recognized due to light refraction of the transparent partition walls BMo and BMa.

Accordingly, the plurality of cables CABa to CABe between the display 180 and the signal processing device 300 are made invisible and thus the display 180 floats in the air, thereby increasing aesthetic effect.

Figure 7:
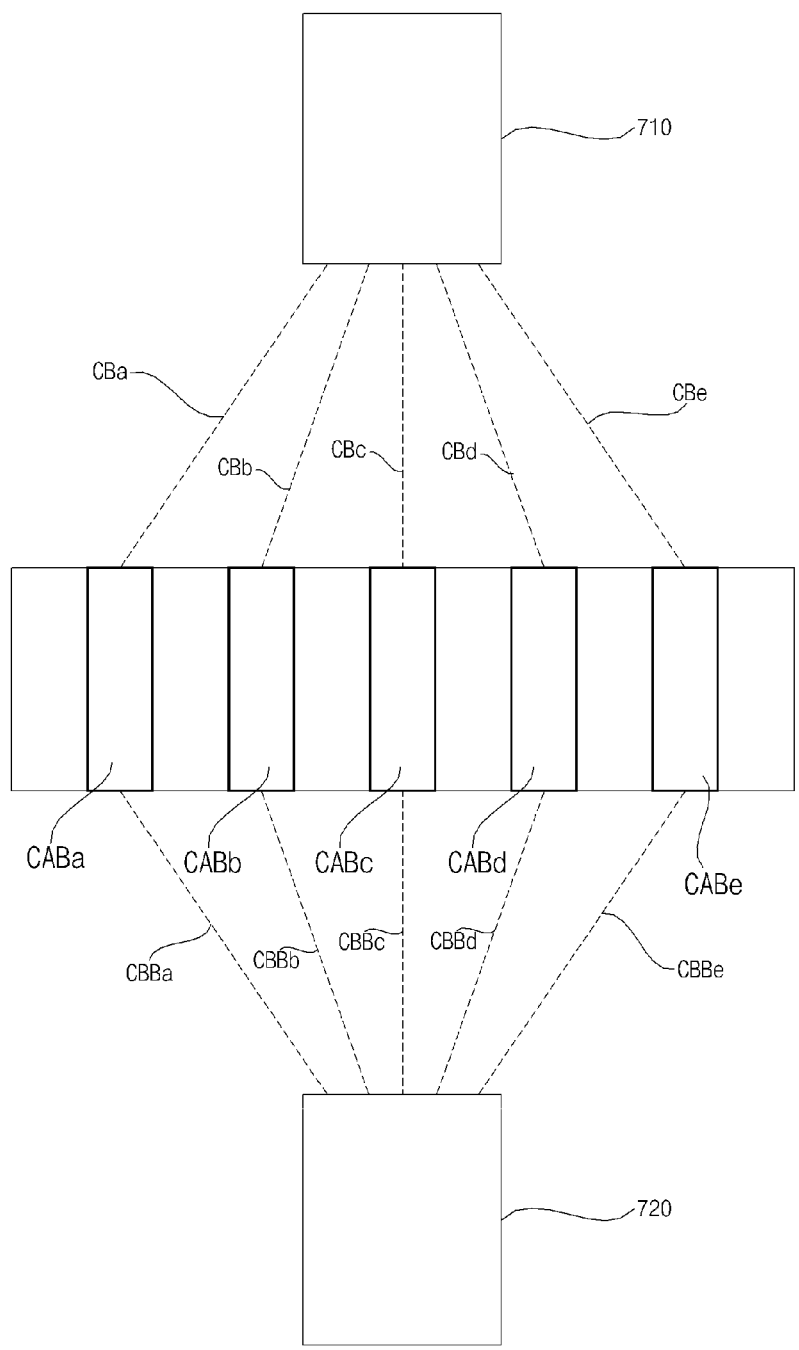
FIG. 7 is a diagram showing connectors at both ends of a plurality of cables of FIG. 1.

FIG. 7 is a diagram showing connectors at both ends of the plurality of cables of FIG. 1.

Referring to the figure, in the present invention, in order to make the cables invisible, the plurality of cables CABa to CABe is provided between the display 180 and the signal processing device 300, and the optical sheet 400 is attached to the plurality of cables CABa to CABe.

The display 180 may include a connector 710 for receiving power and a video signal and cables CBa to CBe between the connector 710 and the plurality of cables CABa to CABe.

In particular, the connector 710 and the cables CBa to CBe may be provided at the rear surface of the display 180, thereby being made invisible from the front side of the display.

The signal processing device 300 may include a connector 720 for transmitting power and a video signal and cables CBBa to CBBe between the connector 720 and the plurality of cables CABa to CABe.

In particular, the connector 720 and the cables CBBa to CBBe may be provided at the rear surface of the signal processing device 300, thereby being made invisible from the front side of the signal processing device.

Figure 8:
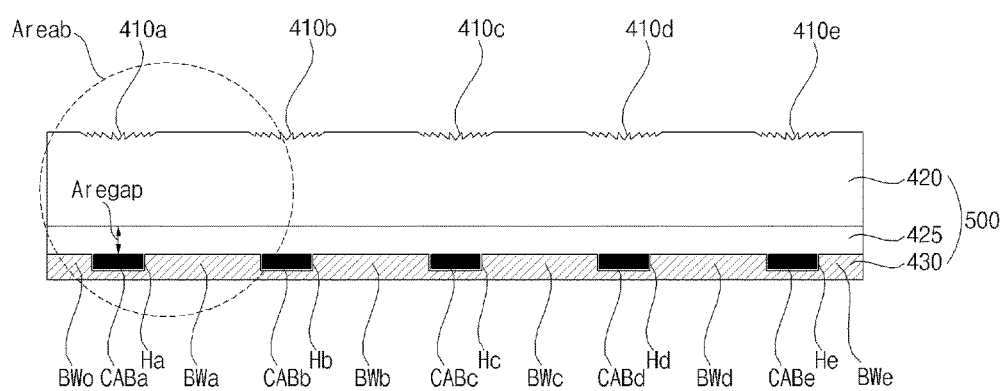
FIG. 8 shows another example of a cross-sectional view taken along line I-I' of FIG. 1.
Figure 9:
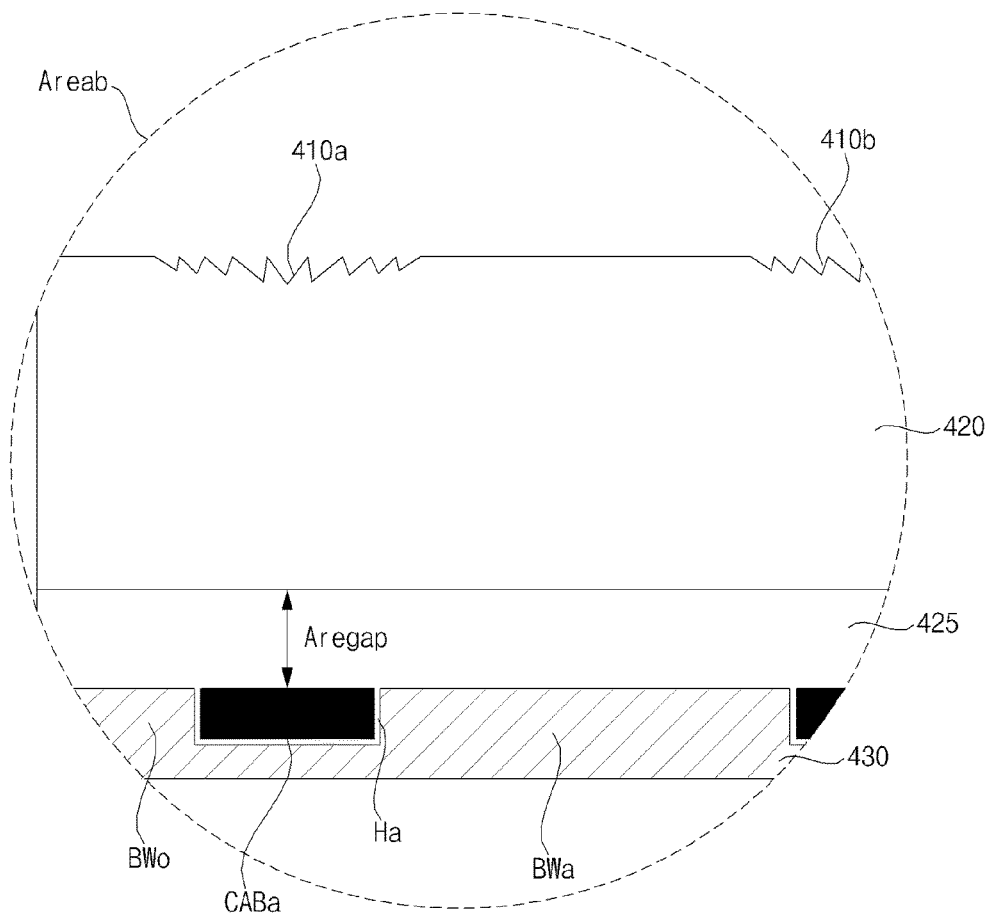
FIG. 9 is an enlarged view of an Area of FIG. 8.

FIG. 8 shows another example of a cross-sectional view taken along line I-I' of FIG. 1, and FIG. 9 is an enlarged view of an Areaa of FIG. 8.

Referring to the figure, the optical sheet 500 of FIGS. 8 and 9 is similar to the optical sheet 300 of FIG. 3 except that an air gap 425 is further included between the transparent partition walls BWo and BWa to BWe and the cables CABa to CABe, and the base part 420.

By the air gap 425, heat generated in the cables CABa to CABe may be externally emitted.

Meanwhile, as described above, the optical sheet 500 of FIG. 8 includes the Fresnel pattern 410 formed on the plurality of cables CABa to CABe and the transparent partition walls BWo and BWa to BWe formed between the plurality of cables CABa to CABe. The Fresnel pattern 410 includes a plurality of peaks Pm and valleys Pv, and the differences in depth between the peaks Pm and the valleys Pv are decreased from the cables CABa to CABe to the transparent partition walls BWo and BWa to BWe.

Therefore, the user located at the front side of the cables CABa to CABe cannot view the cables CABa to CABe and can view the transparent partition walls BWo and BWa to BWe. Accordingly, the cables CABa to CABe provided between the display 180 and the signal processing device 300 may appear transparent.

In addition, the optical sheet 500 of FIG. 8 functions as a lens due to the Fresnel pattern 410. In particular, virtual extensions of a plurality of valleys are aspherical curves and the depth of the valley is increased from the transparent partition walls BWo and BWa to BWe to the cables CABa to CABe, thereby further increasing the refractive index. Therefore, the cables CABa to CABe are made invisible and the transparent partition walls BWo and BWa to BWe are made visible from the front side of the cables CABa to CABe.

The description of the optical sheet 500 of FIGS. 8 and 9 is applicable to the description of FIGS. 3 to 7.

Figure 10:
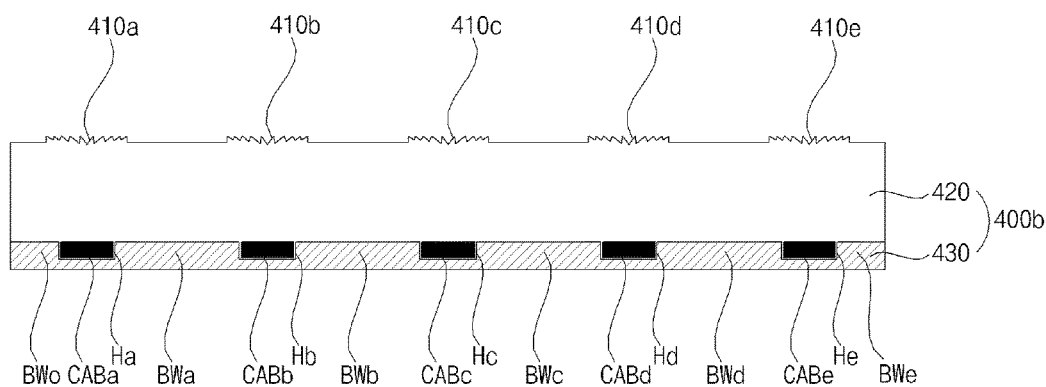
FIG. 10 shows another example of a cross-sectional view taken along line I-I' of FIG. 1.

FIG. 10 shows another example of a cross-sectional view taken along line I-I' of FIG. 1.

Referring to the figure, the optical sheet 400b of FIG. 10 is similar to the optical sheet 400 of FIG. 3 except that the Fresnel patterns 410a to 410b are embossed.

Unlike FIG. 3, the height of the Fresnel patterns 410a to 410b is greater than that of the base part 420.

The other portions are equal to those of FIG. 3 and a description thereof will be omitted.

Figure 11:
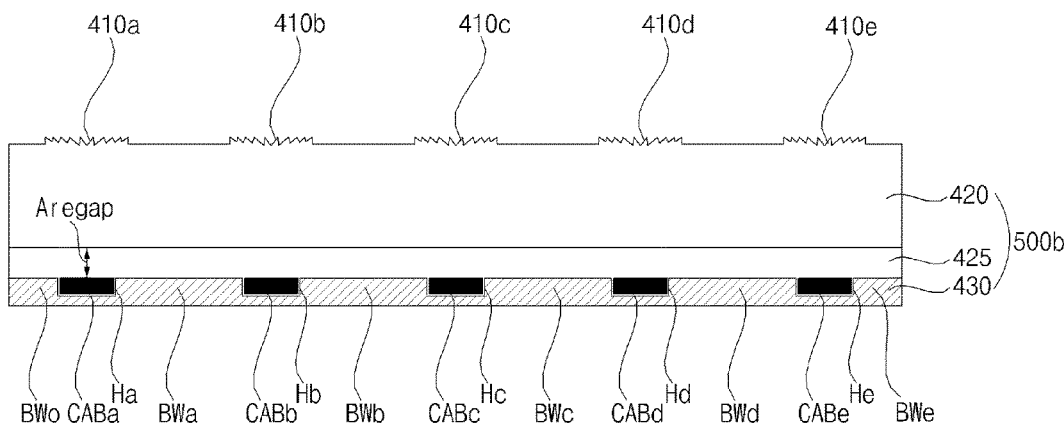
FIG. 11 shows another example of a cross-sectional view taken along line I-I' of FIG. 1.

FIG. 11 shows another example of a cross-sectional view taken along line I-I' of FIG. 1.

Referring to the figure, the optical sheet 500b of FIG. 11 is similar to the optical sheet 500 of FIG. 8 except that the Fresnel patterns 410a to 410b are embossed.

That is, the Fresnel patterns 410a to 410b are embossed in a state in which an air gap 425 is formed.

Unlike FIG. 8, the height of the Fresnel patterns 410a to 410b is greater than that of the base part 420.

Figure 12:
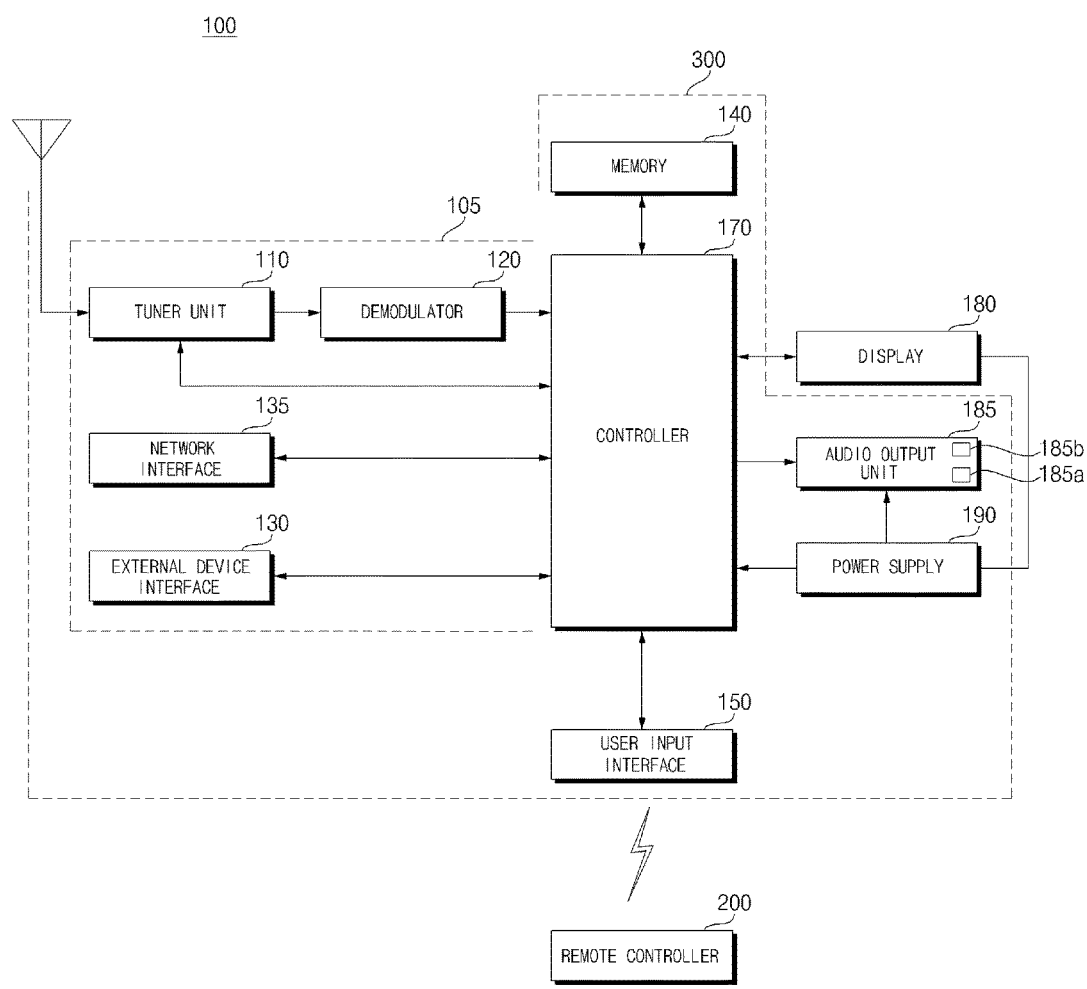
FIG. 12 is a block diagram showing the internal configuration of the image display apparatus of FIG. 1.

FIG. 12 is a block diagram showing the internal configuration of the image display apparatus of FIG. 1.

Referring to FIG. 12, the image display apparatus 100 according to one embodiment of the present invention may include a broadcast reception unit 105, an external interface 130, a memory 140, a user input interface 150, a sensor unit (not shown), a controller 170, a display 180 and an audio output unit 185.

The broadcast reception unit 105 may include a tuner unit 110, a demodulator 120 and a network interface 130. Of course, as needed, the broadcasting reception unit 105 may be configured so as to include only the tuner unit 110 and the demodulator 120 or only the network interface 130.

The broadcast reception unit 105 may include an external device interface (135 of FIG. 12), unlike the figure. For example, a broadcast signal from a set-top box 250 of FIG. 1 may be received through the external device interface (135 of FIG. 12).

The tuner unit 110 tunes to a Radio Frequency (RF) broadcast signal corresponding to a channel selected by a user from among RF broadcast signals received through an antenna 50 or RF broadcast signals corresponding to all channels previously stored in the image display apparatus. The tuned RF broadcast is converted into an Intermediate Frequency (IF) signal or a baseband Audio/Video (AV) signal.

For example, the tuned RF broadcast signal is converted into a digital IF signal DIF if it is a digital broadcast signal and is converted into an analog baseband AV signal (Composite Video Banking Sync/Sound Intermediate Frequency (CVBS/SIF)) if it is an analog broadcast signal. That is, the tuner unit 110 may be capable of processing not only digital broadcast signals but also analog broadcast signals. The analog baseband A/V signal CVBS/SIF may be directly input to the controller 170.

The tuner unit 110 may sequentially select a number of RF broadcast signals corresponding to all broadcast channels previously stored in the image display apparatus by a channel storage function from among a plurality of RF signals received through the antenna and may convert the selected RF broadcast signals into IF signals or baseband A/V signals.

The tuner unit 110 may include a plurality of tuners for receiving broadcast signals corresponding to a plurality of channels or include a single tuner for simultaneously receiving broadcast signals corresponding to the plurality of channels.

The demodulator 120 receives the digital IF signal DIF from the tuner unit 110 and demodulates the digital IF signal DIF.

The demodulator 120 may perform demodulation and channel decoding, thereby obtaining a stream signal TS. The stream signal may be a signal in which a video signal, an audio signal and a data signal are multiplexed.

The stream signal output from the demodulator 120 may be input to the controller 170 and thus subjected to demultiplexing and A/V signal processing. The processed video and audio signals are output to the display 180 and the audio output unit 185, respectively.

The external device interface 130 may transmit or receive data to or from a connected external device (not shown). The external device interface 130 may include an A/V Input/Output (I/O) unit (not shown) or a radio transceiver (not shown).

The external device interface 130 may be connected to an external device such as a Digital Versatile Disc (DVD) player, a Blu-ray player, a game console, a camera, a camcorder, or a computer (e.g., a laptop computer), wirelessly or by wire so as to perform an input/output operation with respect to the external device.

The A/V I/O unit may receive video and audio signals from an external device. The radio transceiver may perform short-range wireless communication with another electronic apparatus.

The network interface 135 serves as an interface between the image display apparatus 100 and a wired/wireless network such as the Internet. For example, the network interface 135 may receive content or data provided by an Internet or content provider or a network operator over a network.

The memory 140 may store various programs necessary for the controller 170 to process and control signals, and may also store processed video, audio and data signals.

In addition, the memory 140 may temporarily store a video, audio and/or data signal received from the external device interface 130. The memory 140 may store information about a predetermined broadcast channel by the channel storage function of a channel map.

While the memory 140 is shown in FIG. 12 as being configured separately from the controller 170, to which the present invention is not limited, the memory 140 may be incorporated into the controller 170.

The user input interface 150 transmits a signal input by the user to the controller 170 or transmits a signal received from the controller 170 to the user.

For example, the user input interface 150 may transmit/receive various user input signals such as a power-on/off signal, a channel selection signal, and a screen setting signal from a remote controller 200, may provide the controller 170 with user input signals received from local keys (not shown), such as inputs of a power key, a channel key, and a volume key, and setting values, provide the controller 170 with a user input signal received from a sensor unit (not shown) for sensing a user gesture, or transmit a signal received from the controller 170 to a sensor unit (not shown).

The controller 170 may demultiplex the stream signal received from the tuner unit 110, the demodulator 120, or the external device interface 130 into a number of signals, process the demultiplexed signals into audio and video data, and output the audio and video data.

The video signal processed by the controller 170 may be displayed as an image on the display 180. The video signal processed by the controller 170 may also be transmitted to an external output device through the external device interface 130.

The audio signal processed by the controller 170 may be output to the audio output unit 185. In addition, the audio signal processed by the controller 170 may be transmitted to the external output device through the external device interface 130.

While not shown in FIG. 12, the controller 170 may include a DEMUX, a video processor, etc., which will be described in detail later with reference to FIG. 13.

The controller 170 may control the overall operation of the image display apparatus 100. For example, the controller 170 controls the tuner unit 110 to tune to an RF signal corresponding to a channel selected by the user or a previously stored channel.

The controller 170 may control the image display apparatus 100 according to a user command input through the user input interface 150 or an internal program.

The controller 170 may control the display 180 to display images. The image displayed on the display 180 may be a Two-Dimensional (2D) or Three-Dimensional (3D) still or moving image.

The controller 170 may generate and display a predetermined object of an image displayed on the display 180 as a 3D object. For example, the object may be at least one of a screen of an accessed web site (newspaper, magazine, etc.), an electronic program guide (EPG), various menus, a widget, an icon, a still image, a moving image, text, etc.

Such a 3D object may be processed to have a depth different from that of an image displayed on the display 180. Preferably, the 3D object may be processed so as to appear to protrude from the image displayed on the display 180.

The controller 170 may recognize the position of the user based on an image captured by the camera unit (not shown). For example, a distance (z-axis coordinate) between the user and the image display apparatus 100 may be detected. An x-axis coordinate and a y-axis coordinate in the display 180 corresponding to the position of the user may be detected.

Although not shown, the image display apparatus may further include a channel browsing processor for generating thumbnail images corresponding to channel signals or external input signals. The channel browsing processor may receive stream signals TS received from the demodulator 120 or stream signals received from the external device interface 130, extract images from the received stream signal, and generate thumbnail images. The thumbnail images may be decoded and output to the controller 170, along with the decoded images. The controller 170 may display a thumbnail list including a plurality of received thumbnail images on the display 180 using the received thumbnail images.

The thumbnail list may be displayed using a simple viewing method of displaying the thumbnail list in a part of an area in a state of displaying a predetermined image or may be displayed in a full viewing method of displaying the thumbnail list in a full area. The thumbnail images in the thumbnail list may be sequentially updated.

The display 180 converts the video signal, the data signal, the OSD signal and the control signal processed by the controller 170 or the video signal, the data signal and the control signal received by the external device interface 130 and generates a drive signal.

The display 180 may be a Liquid Crystal Display (LCD), an Organic Light-Emitting Diode (OLED) display or a flexible display. In particular, the display 180 may be a 3D display.

If the display 180 is a touchscreen, the display 180 may function as not only an output device but also as an input device.

The audio output unit 185 receives the audio signal processed by the controller 170 and outputs the received audio signal as sound.

The audio output unit 185 may include the first speaker unit 185*a* and the second speaker unit 185*b*, as described above. At this time, the second speaker unit 185*b* may include array speakers SHa and SHb including a plurality of speakers.

The camera unit (not shown) captures images of a user. The camera unit (not shown) may be implemented by one camera, but the present invention is not limited thereto. That is, the camera unit may be implemented by a plurality of cameras. The camera unit (not shown) may be embedded in the image display apparatus 100 at the upper side of the display 180 or may be separately provided. Image information captured by the camera unit (not shown) may be input to the controller 170.

The controller 170 may sense a user gesture from an image captured by the camera unit (not shown), a signal sensed by the sensor unit (not shown), or a combination of the captured image and the sensed signal.

The power supply 190 supplies power to the image display apparatus 100. Particularly, the power supply 190 may supply power to the controller 170 which may be implemented as a System On Chip (SOC), the display 180 for displaying the video signal, and the audio output unit 185 for outputting the audio signal.

The power supply 190 may include a converter (not shown) for converting an AC voltage into a DC voltage and a DC/DC converter for changing the level of the DC voltage and outputting the DC voltage with the changed level.

The remote controller 200 transmits user input to the user input interface 150. For transmission of user input, the remote controller 200 may use various communication techniques such as Bluetooth, RF communication, IR communication, Ultra Wideband (UWB), and ZigBee. In addition, the remote controller 200 may receive a video signal, an audio signal or a data signal from the user input interface 150 and output the received signals visually or audibly based on the received video, audio or data signal.

The image display apparatus 100 may be a fixed or mobile digital broadcast receiver.

The block diagram of the image display apparatus 100 illustrated in FIG. 12 is only exemplary. Depending upon the specifications of the image display apparatus 100, the components of the image display apparatus 100 may be combined or omitted or new components may be added. That is, two or more components are incorporated into one component or one component may be configured as separate components, as needed. In addition, the function of each block is described for the purpose of describing the embodiment of the present invention and thus specific operations or devices should not be construed as limiting the scope and spirit of the present invention.

Unlike FIG. 12, the image display apparatus 100 may not include the tuner unit 110 and the demodulator 120 shown in FIG. 12 and may receive image content through the network interface 135 or the external device interface 130 and reproduce the image content.

The image display apparatus 100 is an example of an image signal processing apparatus that processes an image stored in the apparatus or an input image. Other examples of the image signal processing apparatus include a set-top box without the display 180 and the audio output unit 185 shown in FIG. 12, a DVD player, a Blu-ray player, a game console, and a computer.

Figure 13:
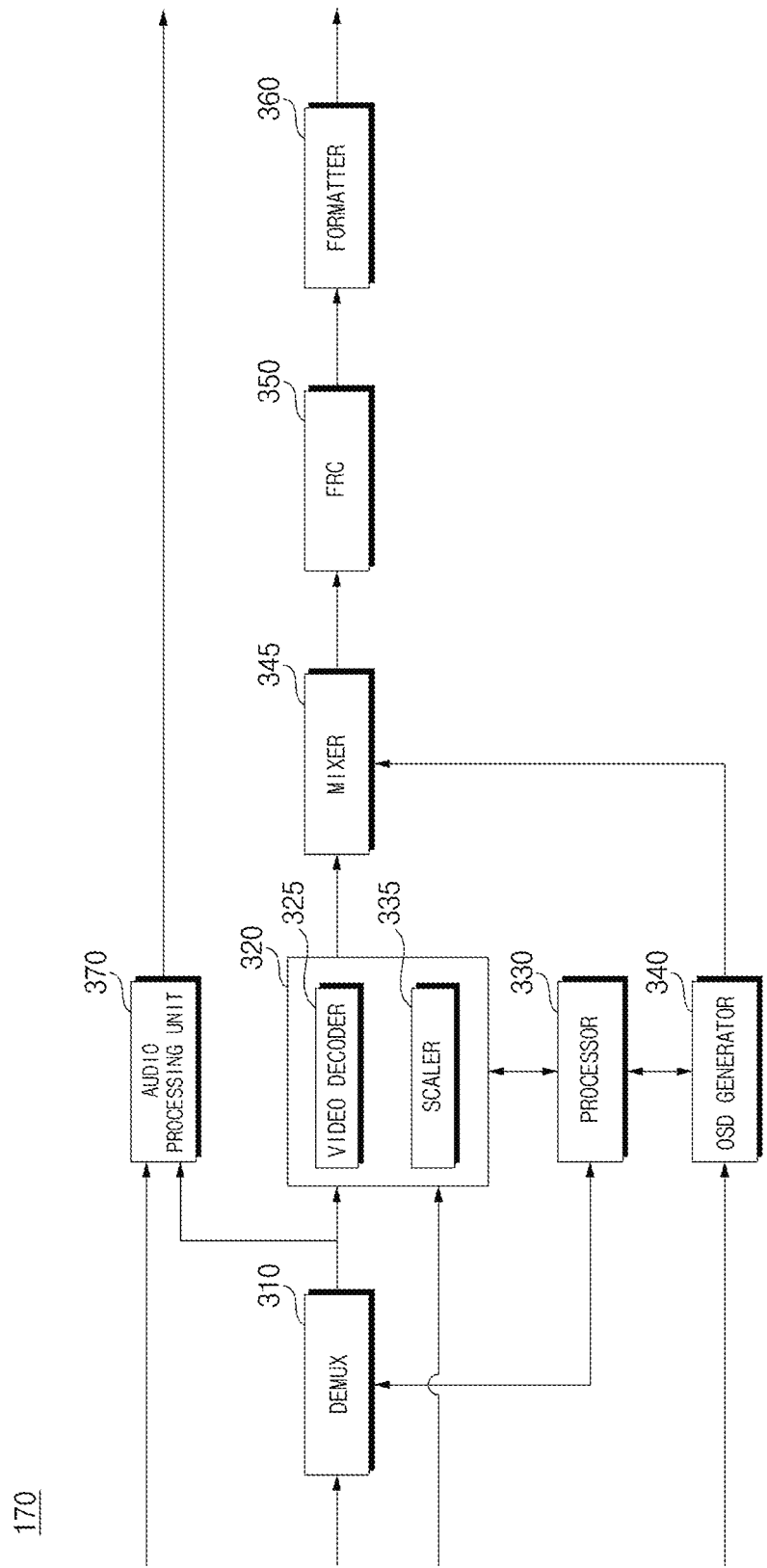
FIG. 13 is a block diagram showing the internal configuration of a controller of FIG. 12.

FIG. 13 is a block diagram showing the internal configuration of the controller of FIG. 12.

Referring to the figure, the controller 170 according to the embodiment of the present invention may include a DEMUX 310, a video processor 320, a processor 330, an OSD generator 340, a mixer 345, a Frame Rate Converter (FRC) 350, a formatter 360, and an audio processor 370. The controller 170 may further include an audio processor 370 and a data processor (not shown).

The DEMUX 310 demultiplexes an input stream. For example, the DEMUX 310 may demultiplex an MPEG-2 TS into a video signal, an audio signal, and a data signal. The stream signal input to the DEMUX 310 may be received from the tuner unit 110, the demodulator 120 or the external device interface 130.

The video processor 320 may process the demultiplexed video signal. For video signal processing, the video processor 320 may include a video decoder 225 and a scaler 235.

The video decoder 325 decodes the demultiplexed video signal and the scaler 235 scales the resolution of the decoded video signal so that the video signal can be displayed on the display 180.

The video decoder 225 may be provided with decoders that operate based on various standards.

The processor 330 may control overall operation of the image display apparatus 100 or the controller 170. For example, the processor 330 may control the tuner unit 110 to tune to an RF broadcast corresponding to an RF signal corresponding to a channel selected by the user or a previously stored channel.

The processor 330 may control the image display apparatus 100 by a user command input through the user input interface 150 or an internal program.

The processor 330 may control data transmission of the network interface 135 or the external device interface 130.

The processor 330 may control the operation of the DEMUX 310, the video processor 320 and the OSD generator 340 of the controller 170.

The OSD generator 340 generates an OSD signal autonomously or according to user input. For example, the OSD generator 340 may generate signals by which a variety of information is displayed as graphics or text on the display 180, according to user input signals. The OSD signal may include a variety of data such as a User Interface (UI), a variety of menus, widgets, icons, etc.

The OSD generator 340 may generate a pointer which can be displayed on the display according to a pointing signal received from the remote controller 200. In particular, such a pointer may be generated by a pointing signal processor and the OSD generator 240 may include such a pointing signal processor (not shown). Alternatively, the pointing signal processor (not shown) may be provided separately from the OSD generator 240.

The mixer 345 may mix the decoded video signal processed by the video processor 320 with the OSD signal generated by the OSD generator 340.

The FRC 350 may change the frame rate of an input image. The FRC 350 may maintain the frame rate of the input image without frame rate conversion.

The formatter 360 may convert a received signal to be suitable for the display 180. For example, the formatter 360 may convert a received signal into a Low Voltage Differential Signal (LVDS) or mini-LVDS.

The audio processor 370 of the controller 170 may process the demultiplexed audio signal. For audio processing, the audio processor 370 may include various decoders.

The audio processor 370 of the controller 170 may also adjust the bass, treble or volume of the audio signal.

The data processor (not shown) of the controller 170 may process the demultiplexed data signal. For example, if the demultiplexed data signal was encoded, the data processor may decode the data signal. The encoded data signal may be Electronic Program Guide (EPG) information including broadcasting information such as the start time and end time of broadcast programs of each channel.

The block diagram of the controller 170 shown in FIG. 13 is exemplary. The components of the block diagrams may be integrated or omitted, or a new component may be added according to the specifications of the controller 170.

In particular, the FRC 350 and the formatter 360 may be included separately from the controller 170.

Figure 14A:
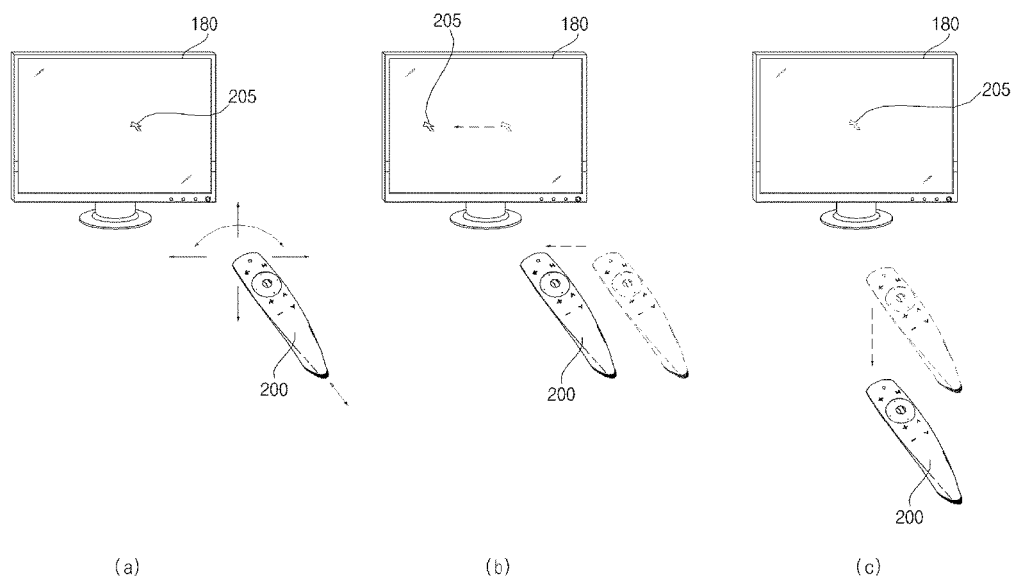
FIG. 14A is a diagram showing a method of controlling a remote controller of FIG. 12.

FIG. 14A is a diagram showing a method of controlling a remote controller of FIG. 12.

As shown in (a) of FIG. 14A, a pointer 205 representing movement of the remote controller 200 is displayed on the display 180.

The user may move or rotate the remote controller 200 up and down, side to side ((b) of FIG. 14A), and back and forth ((c) of FIG. 14A). The pointer 205 displayed on the display 180 of the image display apparatus corresponds to the movement of the remote controller 200. Since the pointer 205 moves according to movement of the remote controller 200 in a 3D space as shown in the figure, the remote controller 200 may be referred to as a pointing device or a 3D pointing device.

Referring to (b) of FIG. 14A, if the user moves the remote controller 200 to the left, the pointer 205 displayed on the display 180 of the image display apparatus 200 moves to the left.

A sensor of the remote controller 200 detects movement of the remote controller 200 and transmits motion information corresponding to the result of detection to the image display apparatus. Then, the image display apparatus may calculate the coordinates of the pointer 205 from the motion information of the remote controller 200. The image display apparatus then displays the pointer 205 at the calculated coordinates.

Referring to (c) of FIG. 14A, while pressing a predetermined button of the remote controller 200, the user moves the remote controller 200 away from the display 180. Then, a selected area corresponding to the pointer 205 may be zoomed in on and enlarged on the display 180. On the contrary, if the user moves the remote controller 200 toward the display 180, the selection area corresponding to the pointer 205 is zoomed out and thus contracted on the display 180. Alternatively, when the remote controller 200 moves away from the display 180, the selection area may be zoomed out on and when the remote controller 200 approaches the display 180, the selection area may be zoomed in on.

With the predetermined button pressed in the remote controller 200, the up, down, left and right movement of the remote controller 200 may be ignored. That is, when the remote controller 200 moves away from or approaches the display 180, only the back and forth movements of the remote controller 200 are sensed, while the up, down, left and right movements of the remote controller 200 are ignored. If the predetermined button of the remote controller 200 is not pressed, only the pointer 205 moves in accordance with the up, down, left or right movement of the remote controller 200.

The speed and direction of the pointer 205 may correspond to the speed and direction of the remote controller 200.

Figure 14B:
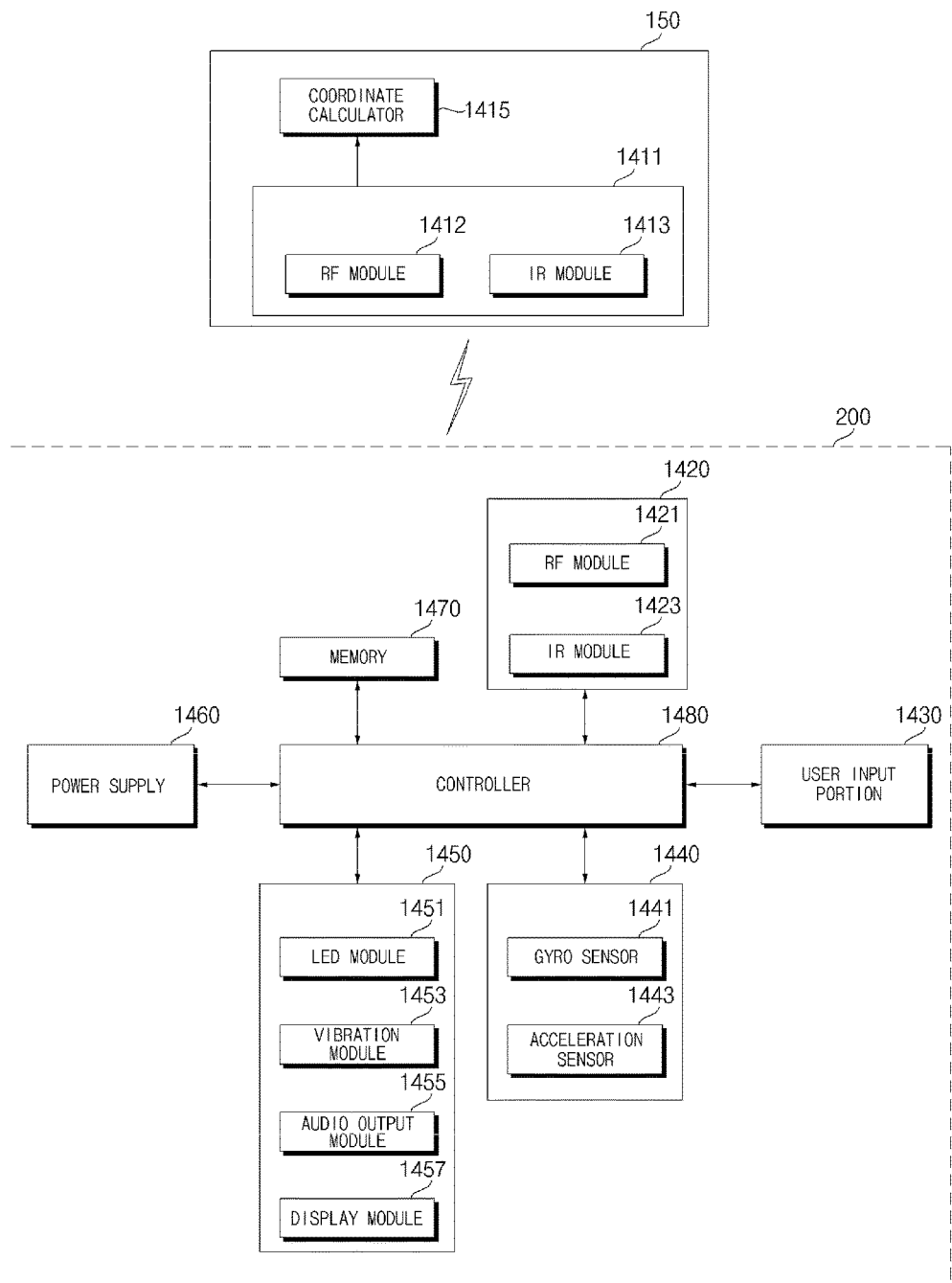
FIG. 14B is a block diagram showing the internal configuration of the remote controller of FIG. 12.

FIG. 14B is a block diagram showing the internal configuration of the remote controller of FIG. 12.

Referring to the figure, the remote controller 200 may include a radio transceiver 1425, a user input unit 1435, a sensor unit 1440, an output unit 1450, a power supply 1460, a memory 1470, and a controller 1480.

The radio transceiver 1425 transmits and receives signals to and from any one of the image display apparatuses according to the embodiments of the present invention. Among the image display apparatuses according to the embodiments of the present invention, for example, one image display apparatus 100 will be described.

In accordance with the exemplary embodiment of the present invention, the remote controller 200 may include an RF module 1421 for transmitting and receiving signals to and from the image display apparatus 100 according to an RF communication standard. Additionally, the remote controller 200 may include an IR module 1423 for transmitting and receiving signals to and from the image display apparatus 100 according to an IR communication standard.

In the present embodiment, the remote controller 200 may transmit information about movement of the remote controller 200 to the image display apparatus 100 via the RF module 1421.

The remote controller 200 may receive the signal from the image display apparatus 100 via the RF module 1421. The remote controller 200 may transmit commands associated with power on/off, channel change, volume change, etc. to the image display apparatus 100 through the IR module 423.

The user input unit 1435 may include a keypad, a key (button), a touch pad or a touchscreen. The user may enter a command related to the image display apparatus 100 to the remote controller 200 by manipulating the user input unit 1435. If the user input unit 1435 includes hard keys, the user may enter commands related to the image display apparatus 100 to the remote controller 200 by pushing the hard keys. If the user input unit 1435 is provided with a touchscreen, the user may enter commands related to the image display apparatus 100 through the remote controller 200 by touching soft keys on the touchscreen. Additionally, the user input unit 1435 may have a variety of input means that can be manipulated by the user, such as a scroll key, a jog key, etc., to which the present invention is not limited thereto.

The sensor unit 1440 may include a gyro sensor 1441 or an acceleration sensor 1443. The gyro sensor 1441 may sense information about movement of the remote controller 200.

For example, the gyro sensor 1441 may sense information about movement of the remote controller 200 along x, y and z axes. The acceleration sensor 1443 may sense information about the speed of the remote controller 200. The sensor unit 1440 may further include a distance measurement sensor for sensing a distance from the display 180.

The output unit 1450 may output a video or audio signal corresponding to manipulation of the user input unit 1435 or a signal transmitted by the image display apparatus 100. The output unit 1450 lets the user know whether the user input unit 1435 has been manipulated or the image display apparatus 100 has been controlled.

For example, the output unit 1450 may include a Light Emitting Diode (LED) module 1451 for illuminating when the user input unit 1435 has been manipulated or a signal is transmitted to or received from the image display apparatus 100 through the radio transceiver 1425, a vibration module 1453 for generating vibrations, an audio output module 1455 for outputting audio, or a display module 1457 for outputting video.

The power supply 1460 supplies power to the remote controller 200. When the remote controller 200 remains stationary for a predetermined time, the power supply 1460 blocks power from the remote controller 200, thereby preventing unnecessary power consumption. When a predetermined key of the remote controller 200 is manipulated, the power supply 1460 may resume power supply.

The memory 1470 may store a plurality of types of programs required for control or operation of the remote controller 200, or application data. When the remote controller 200 transmits and receives signals to and from the image display apparatus 100 wirelessly through the RF module 1421, the remote controller 200 and the image display apparatus 100 perform signal transmission and reception in a predetermined frequency band. The controller 1480 of the remote controller 200 may store information about the frequency band in which signals are wirelessly transmitted received to and from the image display apparatus 100 paired with the remote controller 200 in the memory 1470 and refer to the information.

The controller 1480 provides overall control to the remote controller 200. The controller 1480 may transmit a signal corresponding to predetermined key manipulation of the user input unit 1435 or a signal corresponding to movement of the remote controller 200 sensed by the sensor unit 1440 to the image display apparatus 100 through the radio transceiver 1425.

The user input interface 150 of the image display apparatus 100 may have a radio transceiver 151 for wirelessly transmitting and receiving signals to and from the remote controller 200, and a coordinate calculator 1415 for calculating the coordinates of the pointer corresponding to an operation of the remote controller 200.

The user input interface 150 may transmit and receive signals wirelessly to and from the remote controller 200 through an RF module 1412. The user input interface 150 may also receive a signal from the remote controller 200 through an IR module 1413 based on an IR communication standard.

The coordinate calculator 1415 may calculate the coordinates (x, y) of the pointer 205 to be displayed on the display 180 by correcting hand tremor or errors from a signal corresponding to an operation of the remote controller 200 received through the radio transceiver 151.

A signal transmitted from the remote controller 200 to the image display apparatus 100 through the user input interface 150 is provided to the controller 170 of the image display apparatus 100. The controller 170 may identify information about an operation of the remote controller 200 or key manipulation of the remote controller 200 from the signal received from the remote controller 200 and control the image display apparatus 100 according to the information.

In another example, the remote controller 200 may calculate the coordinates of the pointer corresponding to the operation of the remote controller and output the coordinates to the user input interface 150 of the image display apparatus 100. The user input interface 150 of the image display apparatus 100 may then transmit information about the received coordinates of the pointer to the controller 170 without correcting hand tremor or errors.

As another example, the coordinate calculator 1415 may be included in the controller 170 instead of the user input interface 150.

An image display apparatus according to one embodiment of the present invention includes a display, a signal processing device spaced apart from the display to transmit power and a video signal to the display, a plurality of cables configured to transmit power and the video signal from the signal processing device, and an optical sheet attached to the cables. The optical sheet includes a Fresnel pattern formed on the plurality of cables and transparent partition walls formed between the plurality of cables. The Fresnel pattern includes a plurality of peaks and valleys and differences in depth between the peaks and the valleys are decreased from the cables to the transparent partition walls.

Therefore, a user located at a front side of the cables cannot view the cables but can view transparent partition walls. Accordingly, the cables provided between the display and the signal processing device can appear transparent.

An effect of a lens is implemented by the Fresnel pattern. In particular, virtual extensions of the plurality of valleys are aspherical curves and the depth of the valley increases from the transparent partition walls to the cables, thereby further increasing the refractive index. Therefore, the cables are made invisible and the transparent partition walls are made visible from the front side of the cables.

By setting the width of the Fresnel pattern to be greater than that of the cables, the transparent partition walls are enlarged by refraction of light due to the Fresnel pattern, thereby being recognized to be displayed on the cables.

By setting the height of the base part to be greater than the width of the pattern part in the optical sheet, deterioration of light from the transparent partition walls located near the cables can be reduced.

In addition, by setting the height of the base part to be greater than the width of the cables, deterioration of light from the transparent partition walls located near the cables can be reduced.

Meanwhile, since the Fresnel pattern includes a plurality of peaks and valleys and the angle of the peak is decreased from the transparent partition wall to the cable, refraction of light is increased and thus cable reduction effect can be maximized.

By setting the width of the transparent partition walls to be greater than that of the cables, the cables provided between the display and the signal processing device can appear transparent.

Meanwhile, by further including an air gap formed between the transparent partition walls and the cables, and the base part, heat generated in the cables may be emitted through the air gap.

The signal processing device transmits a pointer image based on the motion information of a remote controller to the display, thereby displaying the pointer image on the display.

An image display apparatus according to another embodiment of the present invention includes a display, a signal processing device spaced apart from the display to transmit power and a video signal to the display, a plurality of cables configured to transmit power and the video signal from the signal processing device, and an optical sheet attached to the cables, wherein the optical sheet includes a Fresnel pattern formed on the plurality of cables and transparent partition walls formed between the plurality of cables, and wherein the Fresnel pattern includes a plurality of peaks and valleys and virtual extensions of the plurality of valleys are aspherical curves. Therefore, a user located at the front side of the cables cannot view the cables and can view the transparent partition walls.

Therefore, the user located at the front side of the cables cannot view the cables and can view the transparent partition walls. Accordingly, the cables provided between the display and the signal processing device can appear transparent.

The image display apparatus according to the present invention should not be limited to configurations and methods of the above-described embodiments, and all or some of the embodiments may be selectively combined with one another to achieve various alterations.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Such modifications should not be individually understood from the technical spirit or prospect of the present invention.

What is claimed is:

1. An image display apparatus comprising:
a display;
a signal processing device spaced apart from the display to transmit power and a video signal to the display;
a plurality of cables configured to transmit power and the video signal from the signal processing device; and
an optical sheet attached to the cables,
wherein the optical sheet includes a Fresnel pattern formed on the plurality of cables and transparent partition walls formed between the plurality of cables, and
wherein the Fresnel pattern includes a plurality of peaks and valleys and differences in depth between the peaks and the valleys are decreased from the cables to the transparent partition walls.

2. The image display apparatus according to claim 1, wherein the differences in depth between the peaks and valleys of the Fresnel pattern are decreased from centers of the cables to the transparent partition walls.

3. The image display apparatus according to claim 1, wherein virtual extensions of the plurality of valleys are aspherical curves.

4. The image display apparatus according to claim 1, wherein the Fresnel patterns are formed in some of the transparent partition walls and the cables.

5. The image display apparatus according to claim 1, wherein a width of the Fresnel pattern is greater than that of the cables.

6. The image display apparatus according to claim 1, wherein the optical sheet further includes:
grooves formed in the transparent partition walls and having the cables provided therein; and
a base part formed on the transparent partition walls and the cables.

7. The image display apparatus according to claim 6, wherein the optical sheet further includes an air gap formed between the transparent partition walls and the cables, and the base part.

8. The image display apparatus according to claim 6, wherein a height of the base part is greater than a width of the Fresnel pattern.

9. The image display apparatus according to claim 6, wherein a height of the base part is 1 to 5 mm.

10. The image display apparatus according to claim 6, wherein a height of the base part is greater than a width of the cables.

11. The image display apparatus according to claim 1, wherein a width of the transparent partition walls is greater than a width of the cables.

12. The image display apparatus according to claim 1, wherein an angle of the peaks is increased from the cables to the transparent partition walls.

13. The image display apparatus according to claim 1, wherein the Fresnel pattern is engraved on the optical sheet.

14. The image display apparatus according to claim 1, wherein the Fresnel pattern is embossed on the optical sheet.

15. The image display apparatus according to claim 1, wherein the signal processing device transmits a pointer image based on motion information of a remote controller to the display through the cables.

16. The image display apparatus according to claim 1, wherein the signal processing device includes a speaker for outputting sound.

17. An image display apparatus comprising:
a display;
a signal processing device spaced apart from the display to transmit power and a video signal to the display;
a plurality of cables configured to transmit power and the video signal from the signal processing device; and
an optical sheet attached to the cables,
wherein the optical sheet includes a Fresnel pattern formed on the plurality of cables and transparent partition walls formed between the plurality of cables, and
wherein the Fresnel pattern includes a plurality of peaks and valleys and virtual extensions of the plurality of valleys are aspherical curves.

18. The image display device according to claim 17, wherein a width of the transparent partition walls is greater than that of the cables.

19. The image display device according to claim 17, wherein an angle of the peaks is increased from the cables to the transparent partition walls.

* * * * *